(12) United States Patent
Lo et al.

(10) Patent No.: US 6,459,716 B1
(45) Date of Patent: Oct. 1, 2002

(54) INTEGRATED SURFACE-EMITTING LASER AND MODULATOR DEVICE

(75) Inventors: Yu-Hwa Lo, San Diego; Zuhua Zhu, La Jolla; Shabbir Bashar, Fremont, all of CA (US)

(73) Assignee: Nova Crystals, Inc., San Jose, CA (US)

( * ) Notice: Subject to any disclaimer, the term of this patent is extended or adjusted under 35 U.S.C. 154(b) by 78 days.

(21) Appl. No.: 09/773,765

(22) Filed: Feb. 1, 2001

(51) Int. Cl.[7] ............................................. H01S 5/026
(52) U.S. Cl. ...................... 372/50; 372/26; 372/29.021; 372/96; 372/102
(58) Field of Search ............................ 372/50, 96, 26, 372/29.021, 102

(56) References Cited

U.S. PATENT DOCUMENTS 6,101,204 A * 8/2000 Johnson, Jr. ................. 372/50

* cited by examiner

*Primary Examiner*—James Davie
(74) *Attorney, Agent, or Firm*—Fish & Neave

(57) ABSTRACT

An integrated surface emitting laser and modulator device is disclosed that includes a detector for monitoring the optical power output of the laser and another detector for monitoring an extinction ratio of the modulator. A cleave physically and electrically separates the laser from the modulator device. The device has a collimating lens disposed on a top surface.

20 Claims, 4 Drawing Sheets

INTEGRATED SURFACE-EMITTING LASER AND MODULATOR DEVICE

FIELD OF THE INVENTION

This invention relates to the field of integrated semiconductor lasers and modulators, and more particularly to integrated distributed feedback (DFB) lasers and electroabsorption (EA) modulators with surface-emitting characteristics.

BACKGROUND OF THE INVENTION

Semiconductor lasers have been the workhorse for fiber optic communication and their role in communication becomes increasingly important as the demand in broadband applications increase rapidly. Overall speaking, there exist no other light sources known to date that can match the size, cost, and performance of semiconductor lasers. However, semiconductor lasers do present a unique set of challenges for optical fiber communication because of their special material and device properties. Asymmetric beam profile and chirping present notable problems. Semiconductor laser research in the last few decades has focused on these problems since semiconductor lasers are the light source of choice for optical communication. Because of the design of semiconductor waveguide and laser cavity, the output beam of a semiconductor laser is elliptical, making efficient laser/fiber coupling a difficult and often costly task. One way to produce a circular output is the surface-emitting laser structure being successfully demonstrated for short wavelength (850 nm) lasers. However, it remains to be a tremendous challenge to make long wavelength (1.3 and 1.55 µm) surface-emitting lasers having a single-mode, symmetric beam profile.

For 1.3 and 1.55 µm lasers, a possible solution is an edge emitting laser with an integrated spot size converter (SSC) that transforms an elliptical beam into a nearly circular beam. However, the extra processing and critical process control make the solution less desirable in cost sensitive systems such as optical LANs. Another critical issue inherent to semiconductor lasers is the much broader linewidth as compared to, for example, solid-state or gas lasers. Under high-speed modulation, the so-called "chirping" effect can significantly broaden the linewidth of a single longitudinal mode laser (e.g., a distributed feedback (DFB) laser) to more than 0.6 nm, measured at 20 dB down from the peak intensity. In the 1.55 µm wavelength regime where the light attenuation in optical fiber is the lowest, such laser linewidth broadening results in dispersion penalty, which is the primary limiting factor for the transmission distance. One solution to the dispersion problem is to externally modulate the laser light instead of directly modulating the laser diode current. Monolithic integration of a semiconductor laser diode with an electro-optic absorption (EA) modulator offers significant advantages than other hybrid approaches. In some advanced devices, the epitaxial layers of the DFB laser and the EA modulator can be formed in a single epitaxial growth run using either the technique of area selective growth or positive wavelength detuning. In the former approach, the growth is performed on a patterned so that different areas of the wafer can have a different growth rate. If the growth rate in the modulator region is slower than the laser region, then the quantum wells in the modulator region will have a blue shift relative to the laser emission, enabling external intensity modulation through the quantum-confined Stark effect. In the latter approach, the active region for the laser and the modulator is identical but the gratings in the laser region have a longer period than the wavelength of the gain peak, also called positive detuning. Since the lasing wavelength for a DFB laser is primarily determined by the grating period, the wavelength that is longer than the natural lasing wavelength matches the modulation wavelength of the optical modulator. Although these devices have been implemented in stand-alone unit, in particular in long haul fiber optic networks, integrating a laser and EA modulator poses a challenge in high volume manufacturing.

Moreover, today's integrated laser/EA modulator devices are still too expensive for broadband optical data networks such as gigabits Ethernet and for telecommunication networks such as metropolitan area network (MAN) and wide area network (WAN). It would therefore be desirable to provide a low-cost, integrated, externally modulated laser-modulator with a controlled output beam profile. In addition, it would be desirable to include an integrated power monitoring detector to monitor in-situ the extinction ratio of the device. The last property is important to avoid the sensitivity penalty due to the reduction of signal extinction ratio.

SUMMARY OF THE INVENTION

The invention is directed to semiconductor laser diode integrated with an external modulator, wherein collimated and/or focused laser radiation is emitted from a major surface. The surface emitting optical beam profile is suitable for fiber coupling. The laser diode can have the structure of a DFB laser having an angle with the axis of the major crystal plane to avoid back coupling of the reflected light into the laser diode. The external modulator can have a similar epitaxial layer structure as the laser diode, but operates in reverse bias. The electrical isolation between the laser and the modulator can be provided by a cleaved facet which creates a small gap between the laser and modulator section, providing excellent electrical isolation with nearly perfect optical coupling between the two sections. The output light from the laser section enters the modulator and is intensity modulated through either Franz-Keldysh effect or quantum confined Stark effect (QCSE) depending on whether the active region is made of bulk crystal or quantum wells. The two cleaved sections are joined to become one unit using either a thick layer of metal or hardened reflowed photoresist. The latter is found to be a more attractive approach because of the simpler process and more desirable properties in terms of adhesion, surface tension, stiffness, and thermal and chemical properties.

At the end of the modulator is an etched facet that directs the beam downward towards the bottom of the substrate, which can include a reflective coating to function as a reflecting mirror. The beam is then reflected upward by the bottom mirror and finally collimated or focused by an integrated microlens. The actual position of the output beam depends on the thickness of the substrate or laser device and the angle of the reflecting facet. The output beam is oriented normal to the major surface with a low and nearly symmetric diffraction angle in both normal axes. To make a collimated output beam, the focal length of the microlens should be designed to be around twice of the substrate thickness, which can be quite easily achieved using the standard microlens fabrication techniques such as resist reflow (refractive lens) and dry etching (diffractive lens). If reflowed resist (e.g. AZ4620) is used as the lens material, it can also be used as the joining material to hold the laser section and the modulator section together.

Embodiments of the invention may include one or more of the following features. The DFB laser section can include a detector that detects the optical power of the laser radiation, in particular laser radiation that is reflected from an end face of the DFB laser section. The modulator section can also include a detector that measures the modulated output power of the surface-emitting laser device which can be, for example, the power averaged over the ON state and the OFF state of the modulator. The extinction ratio of the modulator can then be determined from the ratio of the signals produced by the two detectors. During operation, the bias voltage of the modulator can be adjusted to keep the extinction ratio constant. The DFB laser section can be straight or curved.

The lens that focuses and/or collimates the emitted laser beam can be a refractive or a diffractive optical element. The lens surface and/or the interface between the lens and the major device surface can include an antireflection coating.

Further features and advantages of the present invention will be apparent from the following description of preferred embodiments and from the claims.

BRIEF DESCRIPTION OF THE DRAWINGS

The following figures depict certain illustrative embodiments of the invention in which like reference numerals refer to like elements. These depicted embodiments are to be understood as illustrative of the invention and not as limiting in any way.

DETAILED DESCRIPTION OF CERTAIN ILLUSTRATED EMBODIMENTS

Figure 1:
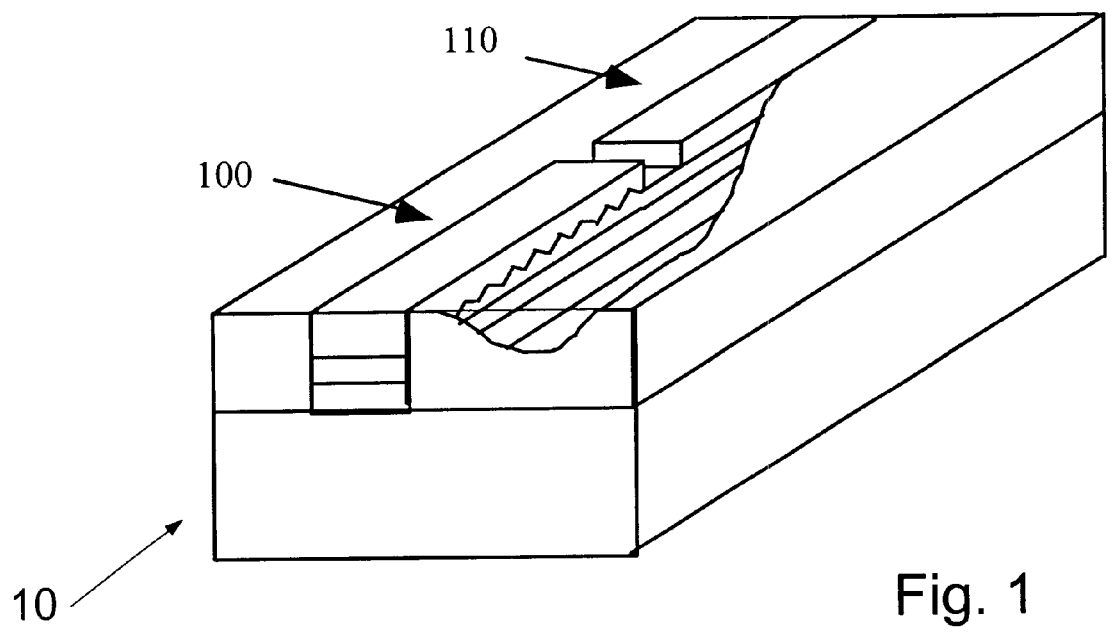
FIG. 1 is a perspective partial section of a prior art integrated DFB laser with an integrated electroabsorption (EA) modulator.
Figure 2:
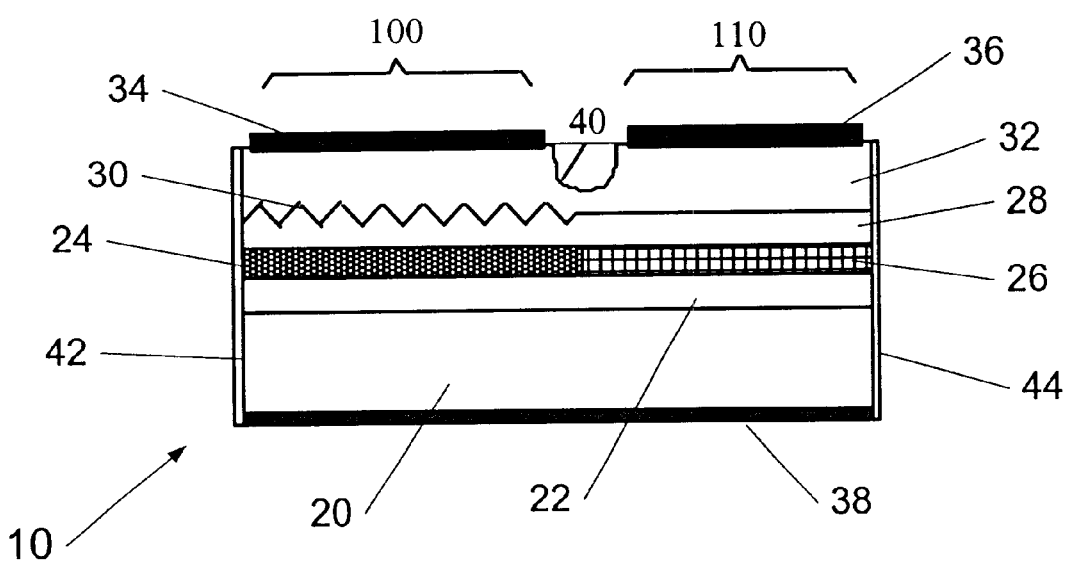
FIG. 2 is a side view of the prior art integrated DFB of FIG. 1.

Referring first to FIGS. 1 and 2, a prior art DFB laser-modulator device 10 includes DFB laser section 100 and an electro-absorption modulator section 110. In general, the device 10 is epitaxially grown on a substrate 20 by conventional processes, such as metal-organic chemical vapor deposition (MOCVD) or molecular beam epitaxy (MBE), and has a lower cladding layer 22, an active layer 24 in the laser section 100 and 26 and in the modulator section 110, respectively, an upper cladding layer 28, an upper contact layer 32 as well as top contacts 34 for the laser section 100 and 36 for the modulator section 110. A grating 30 is disposed in or proximate to the cladding layer 28 in the DFB laser section 100 to provide optical feedback. The grating can be fabricated by photolithographic and etching processes known in the art. InP is an ideal substrate for producing lasers having an emission wavelength of 1.3 µm or 1.5 µm, because InP is transparent to these wavelengths and the epitaxial layers can be readily grown on InP. The cladding and contact layers 28, 32 may be formed using p- and n-doped InP, and the active layer of the laser section 200 and the modulator section 210 may be made of AlInGaAs or InGaAsP (multi-) quantum wells or a bulk layer of about 2000 Å in thickness. To improve the laser performance, a graded index region may be formed on either side of the quantum wells to enhance the optical confinement. The above device structure 10 is similar to that of conventional InP-based edge-emitting lasers. Corresponding layers of the laser section 100 and the modulator section 110 may have identical material composition, but a different thickness to tailor the emission characteristics of the laser section 100 and the absorption characteristics of the modulator section 110. The laser section 100 and the modulator section 10 are typically separated by an etched region 60 that can subsequently be filled with, for example, a high-resistivity epitaxial material to provide electrical isolation between the DFB laser section 100 and the EA modulator section 110. The end face of the laser section 100 can have a high-reflectivity coating 42, whereas the end face of the modulator section 110 can have an antireflection coating 44.

The average laser output power can be monitored, for example, by an external monitor, such as a photodetector (not shown) or another suitable end-facet monitor known in the art. The output signal from the power monitor can be used to provide feedback to stabilize the laser output which may drift due to temperature changes or device degradation. However, unlike multi-mode Fabry-Perot lasers, the ratio of the power output at the front and back facets of a single-mode DFB laser of the type described in FIGS. 1 and 2 tends to be unpredictable and vary from device to device. One reliable way of monitoring the output power of the DFB laser transmitter is therefore to tap the optical power from the output end, which requires external photodetectors properly located in the laser package.

Figure 3:
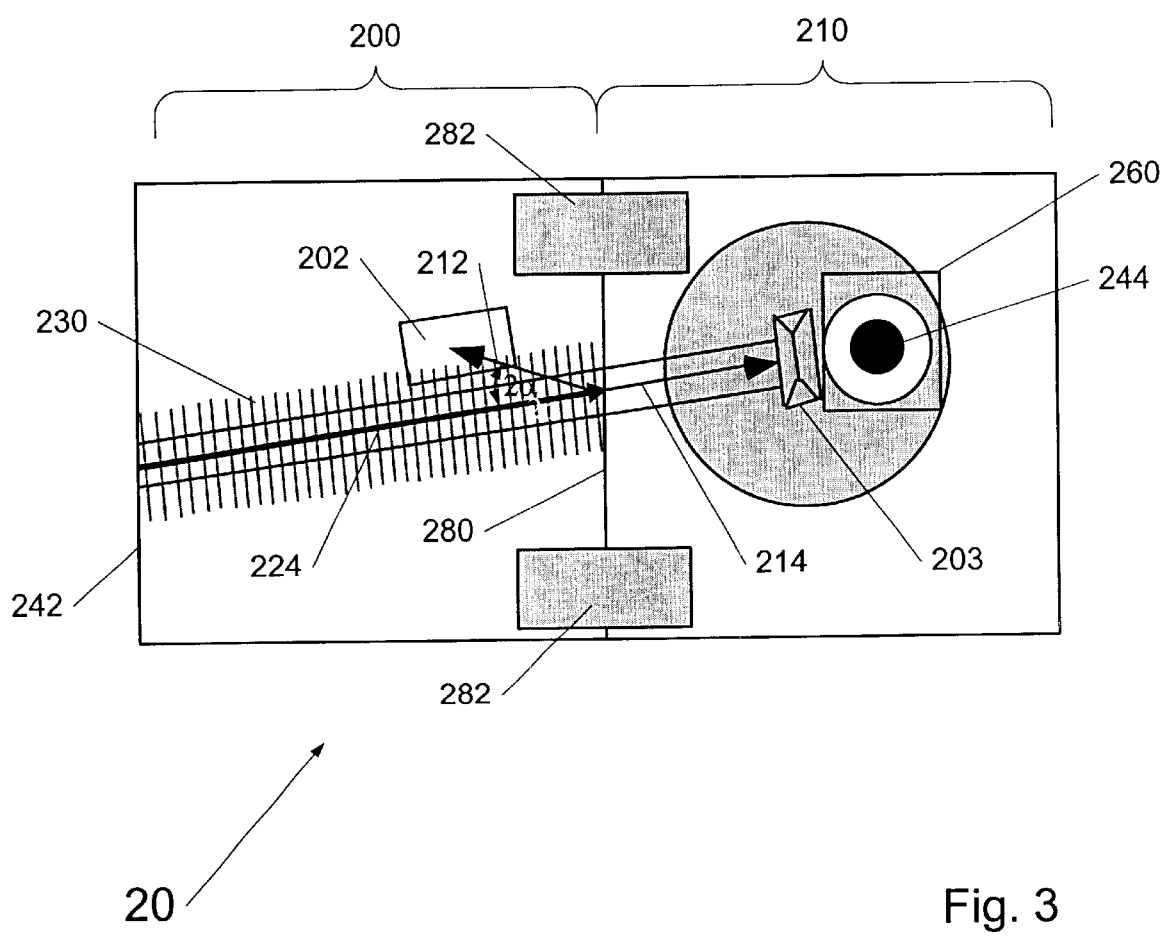
FIG. 3 is a top view of an integrated surface-emitting laser and modulator device according to the invention.
Figure 4:
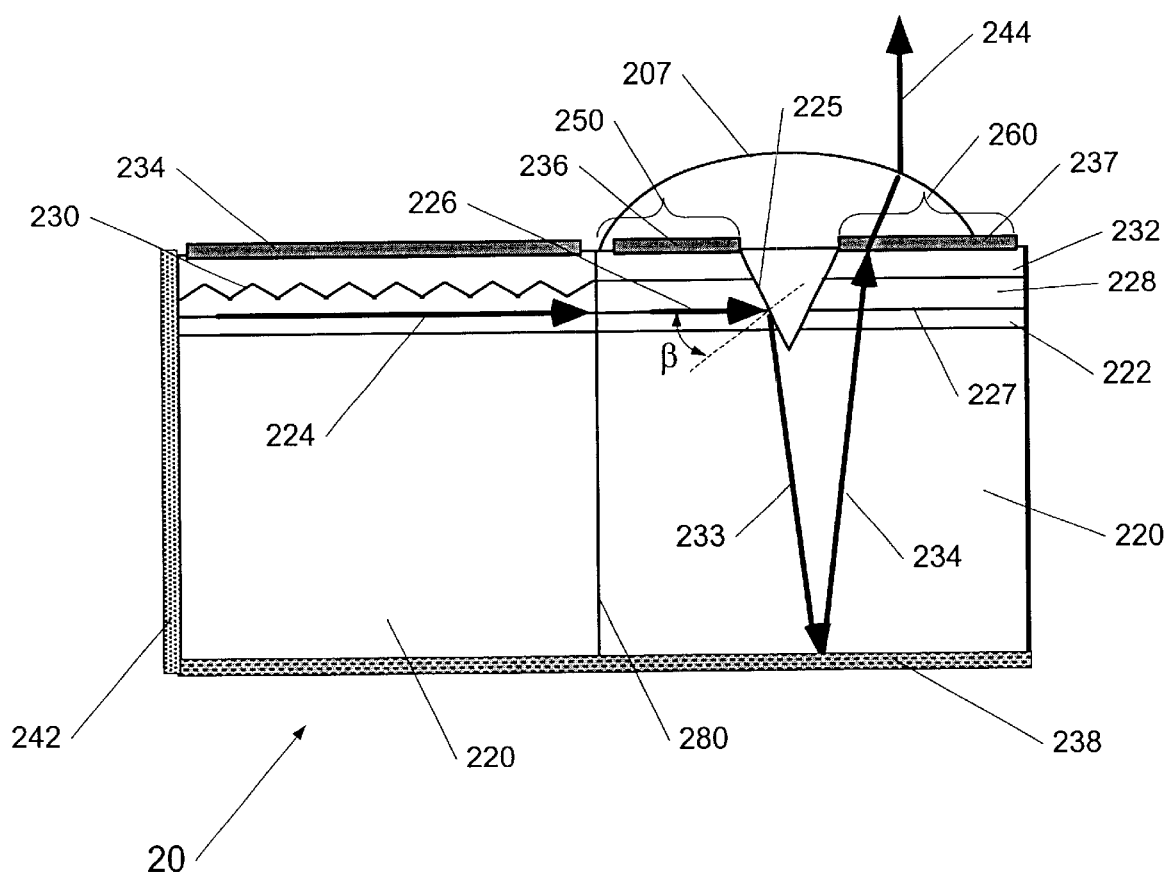
FIG. 4 is a cross-sectional view of the device of FIG. 3.

Referring now to FIGS. 3 and 4, an integrated surface-emitting laser and modulator device according to the invention is described. Like the device 10 of FIGS. 1 and 2, the integrated laser/modulator 20 includes a laser section 200 and a modulator section 210. The modulator section 210, however, not only includes a modulator 250, but also an additional detector section 260 which will be described in more detail below. The integrated laser/modulator 20 includes, as the prior art device 10, a substrate 220, cladding layers 222, 228, an active layers 224 in the laser section, an active layers 226 in the modulator section 226, and an active layers 227 in the additional detector section 260. Contacts 234, 236, 237 are formed in the laser section 200, modulator section 226, and the additional detector section 260, respectively. A grating 230 provides laser feedback to stabilize the lasing wavelength.

The laser section 200 and the modulator section 210 can be produced as one piece, wherein the laser section 200 and the modulator section 210 are subsequently electrically insulated from one another by a gap 280 produced by, for example, cleaving. The two sections 200 and 210 can then optionally be joined by a joining layer 282 which can be made of, for example, a layer of metal or hardened reflowed photoresist. The laser section 200 and the modulator section 210, as best seen in FIG. 3, are oriented at an angle from the normal to the cleavage plane 280, the significance of which will be discussed below. The device 20 furthermore includes a laser power monitor 202 that monitors the laser power reflected from the cleavage plane 280. The device 20 also includes the additional detector section 260 with a separate contact pad 237 to measure an extinction ratio of the modulator 250. Both detectors 202, 260 can have the same layer structure, but are reverse-biased with respect to the laser 200.

As also seen in FIG. 3, the laser 200 produced a laser beam 224 that propagates in the laser waveguide section 200 at an angle α with respect to the surface normal of the cleavage plane 80. At the cleavage plane 280, a portion 212 of the laser beam 224 is reflected back into the laser section 200 towards the power monitor 202 which measures a signal corresponding to the reflected power. The angle 2α is subtended between the propagated laser beam 224 and the reflected portion 212 of the laser beam. Since the power of the reflected portion 212 as a fraction of the laser power 214 incident on the c cleavage plane 280 depends primarily on the physical characteristics of the cleavage plane 280, the reflected power is a reliable and accurate measure of the laser power 214 which is also proportional to the power propagating through the modulator section 250, as indicated by arrow 226. The integrated detector 202 can have the same epitaxial layer structure as the laser diode 200, but will have a separate contact pad (not shown).

The modulator section 210 includes the actual modulator 250 and the second photodetector 260, subsequently also referred to as extinction ratio monitor, with the modulator 250 and the second photodetector 260 separated from one another by a light deflection section 203. The light deflection section 203 is implemented essentially as a V-groove having at least one reflective surface 225 that is inclined with respect to the beam 226 propagating in the waveguide of the modulator section 250. The angle of inclination β is selected so that the beam 226 is totally internally reflected at the reflective surface 225. The minimum angle $β_{min}$ can be calculated from the refractive index of the materials forming the surface 225 using Snell's law. With $n_{GaInAs} ≈ 3$ and $n_{defl.} ≈ 1.3$ (assuming that the deflection section 203 is filled with, for example, a polymer), $β_{min} ≈ 26°$. Geometric considerations furthermore require that the beam 233 after being reflected at the reflective surface 225 is also reflected at the bottom surface 238 of the substrate 220 (beam 234) to efficiently enter the beam correction lens 207, thereby forming the output beam 244. For this reason, $β_{min}$ should be at least equal to 45°.

As seen from FIG. 4, beam 234 passes through the extinction ratio monitor 260 before entering the beam correction lens 207. The monitor 260 hence produces a signal that is proportional to the light intensity exiting the modulator 250. Optionally, an antireflection coating (not shown) can be disposed on the modulator before the beam 234 enters the lens 207, for example, before or after the contact 237.

The deflector 225 may be etched using dry etching techniques such as RIE, ECR, ICP, CAIBE, and ion milling or using wet chemical etching with HBr solutions. To facilitate laser facet cleaving, the InP substrate can be lapped to a thickness of about 80 μm from its original thickness of about 350 μm. The substrate is then polished to achieve a mirror like surface. To further enhance the reflectivity, a layer of a highly reflective metal, such as Al, can be deposited on the thinned polished substrate surface 238, to form both the bottom electrode of the laser diode and the back mirror.

The beam correction lens 207 and the joining layers 282 that hold the two sections 200, 210 together can both be formed using reflowed resist. In first order approximation, the resist-reflowed beam correction lens 207 has a hemispherical shape having its optical axis perpendicular to the top surface of the device structure 210. Additional lens design concerns may be incorporated to reduce aberration and achieve a more circular beam profile.

The extinction ratio monitor 260 can monitor the extinction ratio of the laser/modulator device which is defined as the power transmitted through the modulator 250 in the "ON" state divided by the power transmitted through the modulator in the "OFF" state. When the extinction ratio decreases, the modulation depth also decreases, resulting in an increased signal-to-noise ratio (S/N) of the device. The modulator 250 therefore has to maintain a certain minimum extinction ratio to meet the system specifications. A decrease in the extinction ratio can be caused by, for example, temperature variations, which are of particular concern for data communication systems where transmitters typically operate without active cooling for cost reasons.

The device 20 according to the invention uses the two integrated photodiodes 202, 260 to measure the extinction ratio of the modulator section 210. Referring back to FIG. 3, the first photodiode 202 is the same photodiode as the output power monitoring detector, whereas the second photodiode 260 is the extinction ratio monitor 260 located on the modulator section 210. The detector 260 is located in the modulator section but electrically isolated from the modulator 250. The detector 202 measures the output power of the DFB laser diode 210 operating in cw mode. The photocurrent $I_1$ of the detector 202 is proportional to the cw output power of the laser. As mentioned above, the modulated light passes though the monitor 260 and produces a photocurrent $I_2$ before being emitted from the front surface as output beam 244. The photocurrent $I_2$ in the "ON" or "ONE" state can be written as $I_2^{ON} = K \times I_1$, wherein K is a constant that is independent of the operating state of the device. In the "OFF" or "ZERO" state, the modulator output power is $I_2^{OFF} = R \times K \times I_1$, wherein R is the extinction ratio of the modulator. Because the signal bit stream applied to the modulator is normally scrambled to achieve 50% "on-state" and 50% "off-state" and the bandwidth of the photodiode is much lower than the signal bandwidth (e.g., 10 kHz versus 10 GHz), the average photocurrent $I_2^{Avg}$ can be represented as $I_2^{Avg} = ½ \times (I_2^{ON} + I_2^{OFF}) = ½ \times K \times (1+R) \times I_1^{CW}$. The ratio $I_2^{SAvg}/I_1^{CW}$ or $K \times (1+R)$ for a device is pre-calibrated as a constant. In real operation conditions, the bias voltage of the modulator will be adjusted to keep the ratio constant, which practically guarantees a constant extinction ratio R.

To monitor the extinction ratio, the photodiode 260 may be dc biased at the same level as the "zero state" of the modulator, where light transmission through the modulator 250 is blocked. For example, if the maximal transmission ("ONE" state) of light through the modulator occurs at 0V bias and minimum transmission ("ZERO" state) occurs at 2V bias, then the detector 260 will be biased at 2V and the current $I_2$ measured. An increase in the ratio $I_2^{SAvg}/I_1^{CW}$ indicates that the quantum wells in the modulator do not have enough attenuation in the "zero" state. The extinction ratio can be recovered by adjusting the bias voltage of the modulator 250 and the detector 260 until the ratio $I_2^{SAvg}/I_1^{CW}$ reaches its original value. It should be noted that the method described above is just one method for in-situ monitoring of the extinction ratio. Alternatively, two monitoring detectors can be employed with a modified algorithm to achieve the same purpose.

Figure 5:
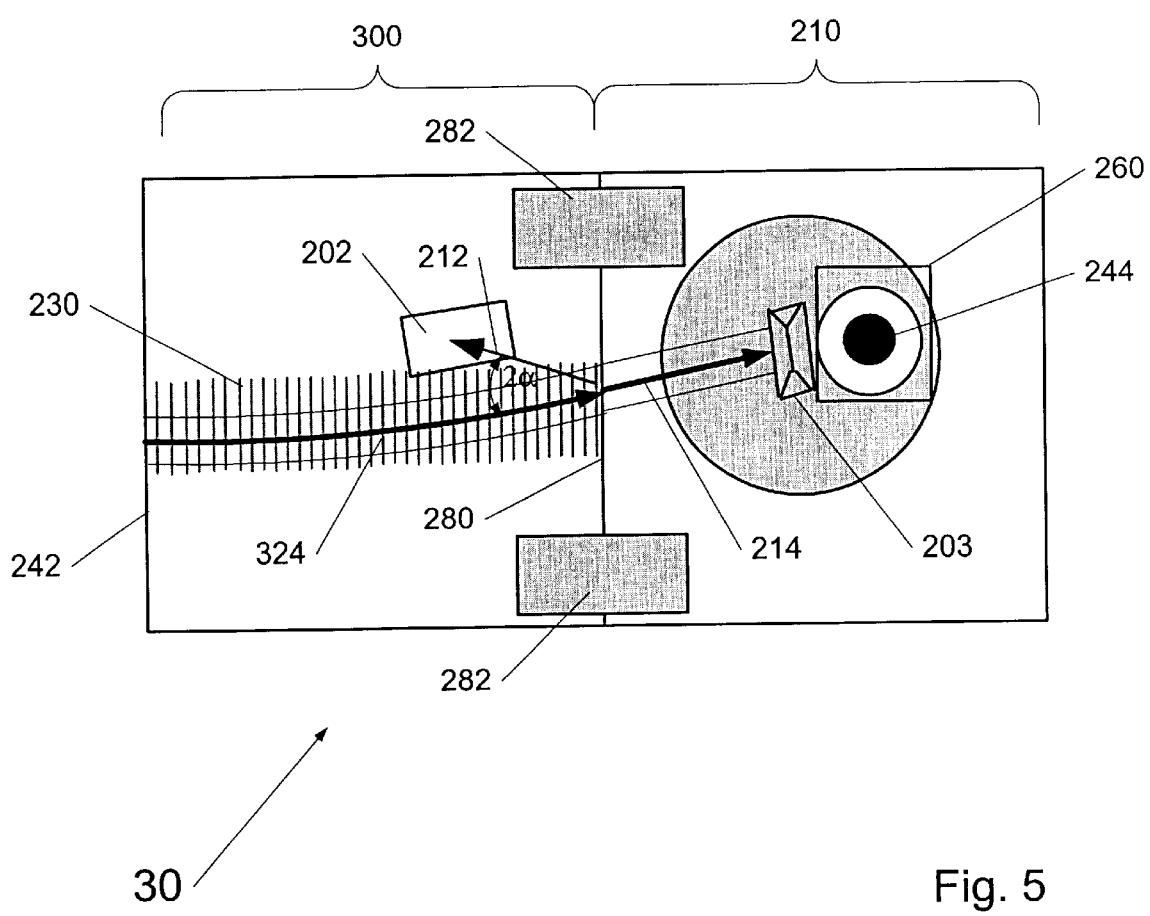
FIG. 5 is an alternative embodiment of the integrated surface-emitting laser and modulator device.

Referring now to FIG. 5, in another embodiment of the laser/modulator device the DFB laser is bent slightly so that the far end facet 242 of the laser 300 facing away from the modulator 214 is perpendicular to the cleaved facet 280 and high-reflectivity coated, whereas the near end facet of the laser 310 at the cleavage plane 280 proximate to the modulator 214 is angled. The large bending radius will not affect the lasing wavelength or the laser threshold. However, this design can simplify the fabrication process and significantly increase the yield for single mode operation. The design also makes it possible to use separate quantum wells for lasers and electro-absorption modulator, obtained in one single growth run. The quantum wells for the laser diode have their central emission wavelength tens of nanometers longer than quantum wells for the modulators and are positioned closer to the p-doped layers. On the other hand, the shorter wavelength quantum wells for the modulator are positioned closer to the n-doped layers. This arrangement also facilitates carrier injection (particularly hole injection) in the laser for low threshold lasers. For the operation of modulators, because the device is reverse biased and the entire quantum well region is depleted, carrier transport is much lesser of a problem. The dual quantum well region should be designed so as to produce a single transverse mode. This limits the total thickness of the dual quantum well region to less than about 0.2 μm.

A representative device fabrication process for the surface-emitting laser/modulator device is outlined below.

Step 1: On a substrate that is transparent to the lasing wavelength, a semiconductor epitaxial layer structure consisting of upper and lower cladding layers and an active region is formed. Selective area growth can be used to distinguish the active regions between the laser and the modulator sections, for example, for creating a wider effective bandgap in the modulator relative to the laser to decrease optical absorption in the modulator.

Step 2: A standard semiconductor laser process used to produce edge-emitting lasers is employed, for example, for photolithography, contact metallization, mirror formation, and the like. The lasing cavity and the modulator waveguide are oriented at an angle to a cleavage plane of the device to reduce back reflection at the cleaved facets which may interfere with the feedback provided by the grating 230, hence possibly degrading the spectral purity of the laser. Moreover, the reflected light would also not be reflected to the laser power monitor detector 202. If the angle is too large, then the optical coupling efficiency between the laser and the modulator may be reduced. Based on these two concerns, an angle of approximately 7° from the normal of the cleavage plan is typically chosen. The detectors for power and extinction ratio monitoring are formed at the same time and on the same substrate as the lasers and modulators.

Step 3: The grating 230 in the laser section 200 for the distributed feedback (DFB) laser can be formed in various ways known in the art. The grating may be formed right next to the ridge waveguide for lateral coupling, or embedded in the epitaxial layers either above (see FIG. 4) or below (not shown) the active region. For the latter, epitaxial regrowth on the corrugated grating surface is required. For DFB lasers, standard techniques including quarter-wave shifting may be employed to assure single mode operation.

Step 4: A light deflection surface 225 to deflect the light from the modulator towards the bottom of the substrate is formed at the end of the modulator section 250. The light deflection surface 225 may be formed by either wet chemical or dry etching techniques known in the art.

Step 5: The substrate is lapped and then polished and the bottom coated to form a mirror surface to reflect the downward propagating modulated laser beam towards the front surface.

Step 6: Microlens(es) is/are formed on the front or back surface of the modulator section to correct the optical beam profile so that the laser beam propagating towards the front surface is focused with a low divergence angle (collimated beam) for coupling into an optical fiber. The microlens(es) may be a refractive lens which can be prepared, for example, a photoresist reflow process, and/or a diffractive lens which can be prepared, for example, by dry etching. The optical axis of the microlens(es) preferably passes through the light deflecting surface.

Step 7: Structures to hold the laser section and the modulator section together are formed either on the front or back surface of the device. The structures can be made of hardened photoresist, electroplated metal such as nickel and the like, to hold the two sections together after the sections are physically separated by cleaving.

Step 8: Cleaving the wafer completes the device fabrication. One cleavage plane forms the back reflector 242 of the DFB laser, with the other cleavage plane 280 electrically isolating the laser and modulator sections from one another. After cleaving, the two sections are held together only by the externally applied layers, such as reflowed resist or electroplated metal.

Step 9: Before the individual devices are removed from the a flexible support layer (not shown) used during the processing steps, the devices are on-wafer tested and bad devices are marked. On-wafer tests can be performed quite easily because the surface emission can be measured both externally and with the integrated on-chip detectors.

It will be understood that the device process may be varied and the sequence of the processing steps altered according to the desired lateral confinement structure of the lasers and modulators (e.g. ridge waveguide, buried heterostructure, etc.).

To achieve low chirping, the electrical isolation between the laser section 200, 300 and the modulator section 210 needs to be greater than approximately 0.5 MΩ. The electrical isolation provided by cleavage in the present invention has consistently and reproducibly shown an isolation resistance of >1 MΩ.

The device according to the invention has eliminated or at least simplified some of the most costly and yield-limiting fabrication steps, namely the etch and epitaxial regrowth for isolation between lasers and modulators and the anti-reflectivity (AR) coating on the output facet of the modulator. AR coating is one of the most costly process because one can at best coat several laser bars at one time rather than coating several wafers at a time. The device according to the invention structure can in principle completely eliminate the need for AR coating on either the DFB facet or the modulator facet. Even if an AR coating is desired to prevent residual coupling of reflected light back into the laser, a uniform AR coating layer can be deposited on the top (output) surface over the entire wafer, saving cost in device processing.

If desired, the integrated microlens can be designed to focus rather than to collimate the output beam so that high efficiency single-mode fiber coupling can be achieved without any additional optics in between. The microlens can also have a compound lens structure to achieve a better optimized beam profile.

With an angle between the laser stripe and the crystal axis, the reflected light can be easily coupled into a detector located next to the emitting facet of the laser diode for power monitoring. This can not be achieved in conventional structure, even though the same angular facet is used, due to the lack of a well-defined reflecting plane between the laser and the modulator.

Multiple detectors can be used to monitor the cw and modulated light output and measure the extinction ratio of the laser/modulator device in situ. The detector pairs can be placed at many suitable locations by simply altering the photolithography masks, with an exemplary location illustrated in FIG. 3. No other major process changes are required.

While the invention has been disclosed in connection with the preferred embodiments shown and described in detail, various modifications and improvements thereon will become readily apparent to those skilled in the art. Accordingly, the spirit and scope of the present invention is to be limited only by the following claims.

We claim:

1. A laser device comprising:
    a distributed feedback (DFB) laser section having two end faces extending substantially perpendicular to a major surface of the device, the DFB laser section producing laser radiation with a front emission direction at a first angle with respect to the two end faces,
    a modulator section with a modulator having a first end face abutting the end face of the DFB laser section having the front emission direction and a second end face being cut at a second angle with respect to the major surface of the device, wherein at least the modulator section has a reflective base,
    wherein the laser radiation is transmitted in the front emission direction from the DFB laser section to the modulator section through the end face of the DFB laser section having the front emission direction and the first end face of the modulator, with the laser radiation being modulated in the modulator and being reflected by the second end face towards the reflective base and further reflected by the reflective base towards the major surface of the modulator section, thereby forming a modulatable surface-emitting laser device.

2. The laser device of claim 1, wherein the DFB laser section further includes a first detector that detects an optical power of the laser radiation.

3. The laser device of claim 2, wherein the first detector receives at least a portion of the laser radiation that is reflected from the one end face of the DFB laser section.

4. The laser device of claim 1, wherein the second angle is selected so as to totally reflect the transmitted laser radiation towards the reflective base.

5. The laser device of claim 1, wherein the second angle is defined by a V-groove provided in the modulator section.

6. The laser device of claim 5, wherein the V-groove and at least a portion of the major surface of the modulator section is covered with a transparent material shaped in the form of a lens for collimating the radiation emitted by the surface-emitting laser device.

7. The laser device of claim 5, wherein the DFB laser section and the modulator section are joined by a joining layer.

8. The laser device of claim 7, wherein the joining layer is made of a metal or a hardened photoresist.

9. The laser device of claim 1, the modulator section further including a second detector that measures a modulated output power of the surface-emitting laser device.

10. The laser device of claim 9, wherein an extinction ratio is determined from signals produced by the first and second detectors, and wherein a bias voltage of the modulator is adjusted to keep the extinction ratio constant.

11. The laser device of claim 1, wherein the modulator is substantially transparent to the laser radiation in an ON state of the modulator.

12. The laser device of claim 1, wherein the modulator section is physically separated from the DFB section by a gap located where the first end face of the modulator section abuts the one end face of the DFB laser section.

13. The laser device of claim 1, wherein the DFB laser section is curved so that a rear emission direction of DFB laser radiation opposite the front emission direction is substantially perpendicular to the two end faces.

14. The laser device of claim 1, further including a lens disposed on the major surface of the modulator section for at least one of focusing and collimating the laser radiation reflected by the reflective base towards the major surface of the modulator section and exiting the modulator section.

15. The laser device of claim 14, wherein the lens is selected from the group consisting of refractive and diffractive optical elements.

16. The laser device of claim 14, further including an antireflection coating disposed between the major surface of the modulator section and the lens.

17. The laser device of claim 14, wherein the lens is made of photoresist.

18. The laser device of claim 3, wherein the angle subtended between the portion of the reflected laser radiation and the front emission direction is twice the first angle.

19. The laser device of claim 14, wherein the lens has a focal length that is approximately twice of a thickness of the laser device.

20. A laser device comprising:
    a first section with a first waveguide extending substantially parallel to a major surface of the device and having end faces extending substantially perpendicular to the major surface, with at least one end face oriented at an angle with respect to the first waveguide, said first waveguide with the end faces adapted to produce laser radiation,
    a first detector formed in the first section and producing an electric signal corresponding to the an optical power of the emitted laser radiation,
    a second section with a second waveguide extending substantially parallel to the major surface of the device, the second section having a first end face abutting the at least one end face of the first waveguide that is oriented at an angle and a second end face being cut at an angle with respect to the major surface of the device, wherein at least the second section has a reflective base,
    wherein laser radiation is transmitted from the first section to the second section through the at least one end face of the first waveguide and the first end face of the second section, the second section capable of modulating the transmitted laser radiation,
    wherein the modulated laser radiation is reflected by the second end face of the first section towards the reflective base and further reflected by the reflective base towards the major surface of the device,
    a second detector formed in the second section and receiving at least a portion of the modulated laser radiation reflected by the reflective base towards the major surface of the device, said second detector producing an electric signal corresponding to an optical power of the modulated laser radiation, and
    a lens disposed on the second section to at least one of focus and collimate the laser radiation reflected by the reflective base towards the major surface of the device.

* * * * *